(12) United States Patent
Venkatadri et al.

(10) Patent No.: US 11,688,709 B2
(45) Date of Patent: Jun. 27, 2023

(54) INTEGRATED DEVICE PACKAGES WITH PASSIVE DEVICE ASSEMBLIES

(71) Applicant: Analog Devices, Inc., Norwood, MA (US)

(72) Inventors: Vikram Venkatadri, Ayer, MA (US); Santosh Anil Kudtarkar, Ayer, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 16/705,123

(22) Filed: Dec. 5, 2019

(65) Prior Publication Data

US 2020/0185346 A1 Jun. 11, 2020

Related U.S. Application Data

(60) Provisional application No. 62/776,342, filed on Dec. 6, 2018.

(51) Int. Cl.
*H01L 23/00* (2006.01)
*H01L 23/498* (2006.01)
(Continued)

(52) U.S. Cl.
CPC .......... *H01L 24/24* (2013.01); *H01L 23/3128* (2013.01); *H01L 23/49816* (2013.01);
(Continued)

(58) Field of Classification Search
CPC ... H01L 24/24; H01L 24/48; H01L 23/49816; H01L 23/3128; H01L 27/14661;
(Continued)

(56) References Cited

U.S. PATENT DOCUMENTS 3,553,030 A  1/1971 Lebrun
4,883,967 A  11/1989 Tsutsui et al.
(Continued)

FOREIGN PATENT DOCUMENTS

CN  109346539 A  2/2019
EP  1852716 A3  11/2007
(Continued)

OTHER PUBLICATIONS

International Search Report issued in application No. PCT/US2019/064644 dated Mar. 26, 2020.
(Continued)

*Primary Examiner* — Duy T Nguyen
(74) *Attorney, Agent, or Firm* — Knobbe, Martens, Olson & Bear, LLP

(57) ABSTRACT

An integrated device package is disclosed. The package can include a package substrate and an integrated device die having active electronic circuitry. The integrated device die can have a first side and a second side opposite the first side. The first side can have bond pads electrically connected to the package substrate by way of bonding wires. A redistribution layer (RDL) stack can be disposed on a the first side of the integrated device die. The RDL stack can comprise an insulating layer and a conductive redistribution layer. The package can include a passive electronic device assembly mounted and electrically connected to the RDL stack.

17 Claims, 4 Drawing Sheets

(51) Int. Cl.
*H01L 23/31* (2006.01)
*H01L 27/146* (2006.01)
*H01L 23/552* (2006.01)

(52) U.S. Cl.
CPC .. *H01L 23/49822* (2013.01); *H01L 23/49838* (2013.01); *H01L 23/552* (2013.01); *H01L 24/05* (2013.01); *H01L 24/48* (2013.01); *H01L 27/14632* (2013.01); *H01L 27/14661* (2013.01); *H01L 2224/04042* (2013.01); *H01L 2224/24265* (2013.01); *H01L 2224/48091* (2013.01); *H01L 2224/48106* (2013.01); *H01L 2224/48225* (2013.01); *H01L 2924/19041* (2013.01); *H01L 2924/19102* (2013.01); *H01L 2924/3025* (2013.01)

(58) Field of Classification Search
CPC ............. H01L 23/552; H01L 27/14632; H01L 23/49838; H01L 23/49822; H01L 24/05; H01L 2924/3025; H01L 2224/04042; H01L 2224/24265; H01L 2924/19102; H01L 2924/19041; H01L 2224/48091; H01L 2224/48106; H01L 2224/48225; H01L 24/32; H01L 24/73; H01L 2224/73257; H01L 24/16; H01L 2224/16227; H01L 2224/32225; H01L 2224/73207; H01L 2224/32265; H01L 2224/73215; H01L 2224/73253; H01L 25/0657; H01L 25/16; H01L 27/14618; H01L 23/5383
USPC ......................................................... 257/428
See application file for complete search history.

(56) References Cited

U.S. PATENT DOCUMENTS

| | | | |
|---|---|---|---|
| 5,487,098 A | 1/1996 | Dobbs et al. | |
| 5,528,043 A | 6/1996 | Spivey et al. | |
| 5,801,385 A | 9/1998 | Endo et al. | |
| 5,889,313 A | 3/1999 | Parker | |
| 6,300,679 B1 | 10/2001 | Mukerji et al. | |
| 6,323,891 B1 | 11/2001 | Kitani et al. | |
| 6,396,898 B1 | 5/2002 | Saito et al. | |
| 6,426,991 B1 | 7/2002 | Mattson et al. | |
| 6,476,417 B2 | 11/2002 | Honda et al. | |
| 6,510,195 B1 | 1/2003 | Chappo et al. | |
| 6,573,506 B2 | 6/2003 | Sato et al. | |
| 6,601,947 B1 | 8/2003 | Sato et al. | |
| 6,667,480 B2 | 12/2003 | Kajiwara et al. | |
| 7,067,817 B2 | 6/2006 | Suganuma et al. | |
| 7,148,084 B2 | 12/2006 | Strobel et al. | |
| 7,189,971 B2 | 3/2007 | Spartiotis | |
| 7,193,218 B2 | 3/2007 | Nagano | |
| 7,202,482 B2 | 4/2007 | Yokoi et al. | |
| 7,339,176 B2 | 3/2008 | El-Hanany et al. | |
| 7,358,501 B2 | 4/2008 | Danzer et al. | |
| 7,382,043 B2 | 6/2008 | Longden et al. | |
| 7,468,514 B1 | 12/2008 | Suzuki et al. | |
| 7,504,637 B2 | 3/2009 | Thorne | |
| 7,504,701 B2 | 3/2009 | Moribayashi et al. | |
| 7,544,947 B2 | 6/2009 | Kerwin et al. | |
| 7,696,610 B2 | 4/2010 | Patterson | |
| 8,000,437 B2 | 8/2011 | Kotooka | |
| 8,829,454 B2 | 9/2014 | Bologna | |
| 8,859,975 B2 | 10/2014 | Tokura et al. | |
| 8,866,098 B2 | 10/2014 | Hayatsu et al. | |
| 9,035,457 B2 | 5/2015 | Lin et al. | |
| 9,116,022 B2 | 8/2015 | Bologna | |
| 9,171,878 B2 | 10/2015 | Yaoi et al. | |
| 9,324,687 B1 | 4/2016 | Kelkar et al. | |
| 9,466,594 B2 | 10/2016 | Bologna | |
| 9,583,472 B2 | 2/2017 | Chung et al. | |
| 9,835,733 B2 | 12/2017 | Ying | |
| 9,837,352 B2 | 12/2017 | Chang et al. | |
| 10,276,525 B2 | 4/2019 | Hsiao et al. | |
| 10,340,302 B2 | 7/2019 | Bolognia et al. | |
| 2002/0011572 A1 | 1/2002 | Kajiwara et al. | |
| 2002/0070343 A1 | 6/2002 | Hoffman | |
| 2002/0079445 A1 | 6/2002 | Hantschel et al. | |
| 2002/0148968 A1 | 10/2002 | Der Haar | |
| 2002/0153492 A1 | 10/2002 | Sekine et al. | |
| 2003/0010924 A1 | 1/2003 | El-Hanany et al. | |
| 2003/0097875 A1 | 5/2003 | Lentz et al. | |
| 2004/0223583 A1 | 11/2004 | Tsujii | |
| 2005/0029463 A1 | 2/2005 | Kaemmerer | |
| 2005/0067178 A1 | 3/2005 | Pearson et al. | |
| 2005/0285973 A1 | 12/2005 | Singh et al. | |
| 2006/0223227 A1 | 10/2006 | Kubota et al. | |
| 2007/0045556 A1 | 3/2007 | Watanabe et al. | |
| 2007/0066139 A1* | 3/2007 | Roeper | H01L 23/3107 257/E23.124 |
| 2007/0096249 A1* | 5/2007 | Roeper | H01L 23/147 257/528 |
| 2007/0152148 A1 | 7/2007 | Chao et al. | |
| 2007/0183184 A1 | 8/2007 | Nakamura et al. | |
| 2007/0221859 A1 | 9/2007 | Nakata | |
| 2008/0011959 A1 | 1/2008 | Thorne | |
| 2008/0100732 A1 | 5/2008 | Minamio et al. | |
| 2008/0112150 A1 | 5/2008 | Jones | |
| 2008/0197480 A1* | 8/2008 | Yang | H01L 23/3121 257/E23.181 |
| 2008/0283764 A1 | 11/2008 | Kerwin | |
| 2009/0084971 A1 | 4/2009 | Ohta et al. | |
| 2009/0121146 A1 | 5/2009 | Luhta et al. | |
| 2010/0078565 A1 | 4/2010 | Tsubota et al. | |
| 2010/0224785 A1 | 9/2010 | Chiyoma et al. | |
| 2010/0276572 A1 | 11/2010 | Iwabuchi et al. | |
| 2011/0024888 A1* | 2/2011 | Pagaila | H01L 25/0657 257/686 |
| 2011/0133939 A1 | 6/2011 | Ranganathan et al. | |
| 2011/0156248 A1* | 6/2011 | Matsuki | H01L 24/03 257/737 |
| 2011/0272588 A1 | 11/2011 | Jadrich et al. | |
| 2011/0304015 A1 | 12/2011 | Kim et al. | |
| 2012/0097857 A1 | 4/2012 | Hayatsu et al. | |
| 2012/0119388 A1* | 5/2012 | Cho | H01L 24/11 257/778 |
| 2012/0126381 A1 | 5/2012 | Uenda et al. | |
| 2013/0221468 A1 | 8/2013 | Bologna | |
| 2014/0027637 A1 | 1/2014 | Watano | |
| 2014/0159226 A1 | 6/2014 | Bologna | |
| 2014/0291819 A1* | 10/2014 | Barth | H01L 23/147 257/659 |
| 2015/0061043 A1 | 3/2015 | Bologna | |
| 2015/0340327 A1* | 11/2015 | Uzoh | H01L 24/48 257/723 |
| 2016/0093796 A1 | 3/2016 | Arai | |
| 2016/0293575 A1* | 10/2016 | Liu | H01L 24/19 |
| 2016/0320495 A1 | 11/2016 | Ying et al. | |
| 2016/0322300 A1 | 11/2016 | Song et al. | |
| 2016/0322418 A1 | 11/2016 | Leblans et al. | |
| 2016/0322562 A1 | 11/2016 | Jang et al. | |
| 2017/0025463 A1 | 1/2017 | Bolognia et al. | |
| 2017/0084521 A1 | 3/2017 | Chang et al. | |
| 2017/0188458 A1 | 6/2017 | Hsieh et al. | |
| 2017/0230597 A1 | 8/2017 | Fahim et al. | |
| 2017/0258422 A1 | 9/2017 | Kim et al. | |
| 2017/0287849 A1 | 10/2017 | Takaku | |
| 2017/0307766 A1 | 10/2017 | Abenaim et al. | |
| 2018/0019035 A1 | 1/2018 | Baturin | |
| 2018/0100937 A1 | 4/2018 | Luhta et al. | |
| 2018/0102470 A1 | 4/2018 | Das et al. | |
| 2018/0210096 A1 | 7/2018 | Luhta et al. | |
| 2019/0067034 A1 | 2/2019 | Pachamuthu et al. | |
| 2019/0088636 A1 | 3/2019 | Gamini | |
| 2019/0363226 A1 | 11/2019 | Musashi et al. | |

(56) References Cited

U.S. PATENT DOCUMENTS

| | | |
|---|---|---|
| 2020/0185346 A1 | 6/2020 | Venkatadri et al. |
| 2020/0185450 A1 | 6/2020 | Venkatadri |

FOREIGN PATENT DOCUMENTS

| | | |
|---|---|---|
| JP | 10-284633 | 10/1998 |
| JP | 2001-099942 | 4/2001 |
| JP | 2002-022841 | 1/2002 |
| JP | 2006-052978 | 2/2006 |
| JP | 2006-351765 | 12/2006 |
| JP | 2008-171881 | 7/2008 |
| JP | 2008-268038 | 11/2008 |
| JP | 2009-189384 | 8/2009 |
| JP | 2012-088152 | 5/2012 |
| WO | WO 2007/039840 | 4/2007 |
| WO | WO 2009/066556 | 5/2009 |
| WO | WO 2010/137396 | 2/2010 |
| WO | WO 2015/138359 A1 | 9/2015 |
| WO | WO 2015/179764 A1 | 11/2015 |
| WO | WO 2016/048367 A1 | 3/2016 |
| WO | WO 2018/182754 A1 | 10/2018 |

OTHER PUBLICATIONS

International Search Report issued in application No. PCT/US2019/064770 dated Mar. 17, 2020.
Written Opinion issued in application No. PCT/US2019/064644 dated Mar. 26, 2020.
Written Opinion issued in application No. PCT/US2019/064770 dated Mar. 17, 2020.
Bellenger et al., "Silicon Interposers with Integrated Passive Devices: Ultra-Miniaturized Solution using 2.5D Packaging Platform", IPDIA, accessed Sep. 10, 2019.
Cesmeli, Erdogan Ph.D., "V-Res—Detecting the Difference in Volume CT," GE Healthcare Publication.
Extended Search Report dated May 26, 2015 in European Application No. 13755853.2 filed Aug. 4, 2014 in 6 pages.
International Search Report and Written Opinion of the International Search Authority in PCT/US2013/027643, dated Jun. 24, 2013, 12 pages.
Maloney, Lawrence D., "Close Cooperation Among A Global Engineering Team Led to the Success of the Lightspeed VCT Medical Scanner," Test & Measurement World Aug. 2005.
"Micromachining—Function in a Small Package," SSC00-X-3, to Fox et al., p. 107, available at http://digitalcommons.usu.edu/cgi/viewcontent.cgi?article=2100&content=smallsat.
Office Action in U.S. Appl. No. 13/405,594 dated Aug. 6, 2013.
Office Action in U.S. Appl. No. 13/405,594 dated Dec. 14, 2013.
Office Action in U.S. Appl. No. 14/478,810 dated Oct. 29, 2015 in 15 pages.
Office Action received in U.S. Appl. No. 14/478,810 dated Feb. 23, 2016 in 13 pages.
Office Action received in U.S. Appl. No. 13/708,727 dated Oct. 30, 2014 in 12 pages.
Office Action received in U.S. Appl. No. 14/805,835 dated Oct. 20, 2016 in 15 pages.
Office Action received in U.S. Appl. No. 14/805,835 dated May 1, 2017 in 13 pages.
Office Action received in U.S. Appl. No. 14/805,835 dated Sep. 25, 2017 in 17 pages.
Office Action received in U.S. Appl. No. 14/805,835 dated Jun. 12, 2018 in 16 pages.
Office Action received in U.S. Appl. No. 16/705,105 dated Jul. 26, 2021 in 26 pages.
Office Action received in U.S. Appl. No. 16/705,105 dated Nov. 5, 2021 in 26 pages.
Office Action received in U.S. Appl. No. 16/705,105 dated Mar. 21, 2022 in 26 pages.
Office Action dated Dec. 30, 2015 issued in Chinese Application No. CN 201380011120.5.
Office Action received in Chinese Patent Application No. CN2018113531 dated Jul. 28, 2021, 6 pages.
Office Action received in Chinese Patent Application No. CN2018113531 dated Apr. 6, 2022, 9 pages.

\* cited by examiner

INTEGRATED DEVICE PACKAGES WITH PASSIVE DEVICE ASSEMBLIES

CROSS-REFERENCE TO RELATED APPLICATIONS

This application claims priority to U.S. Provisional Patent Application No. 62/776,342, filed Dec. 6, 2018, the entire contents of which are hereby incorporated by reference in their entirety and for all purposes.

BACKGROUND

Field

The field relates to integrated device packages with passive device assemblies.

Description of the Related Art

Various types of electronic systems can include passive electronic components, such as capacitors, resistors, inductors, etc. The passive electronic components can be used to condition or filter electrical signals before or after being processed by other components of the electronic system. Incorporation of passive electronic components into electronic systems can occupy valuable board space and, accordingly, increase the footprint of the electronic system. Moreover, connecting passive electronic components to other devices in the system may introduce electrical losses. Accordingly, there remains a continuing need for improved incorporation of passive electronic components into electronic systems.

SUMMARY

In one embodiment, an integrated device package is disclosed. The integrated device package can include a package substrate and an integrated device die having active electronic circuitry. The integrated device die can have a first side and a second side opposite the first side, the first side comprising bond pads electrically connected to the package substrate by way of bonding wires. The package can comprise a redistribution layer (RDL) stack disposed on the first side of the integrated device die, the RDL stack comprising an insulating layer and a conductive redistribution layer. The package can comprise a passive electronic device assembly mounted and electrically connected to the RDL stack.

In another embodiment, sensor module is disclosed. The sensor module can comprise an electronic device. The electronic device can comprise an element and a redistribution layer (RDL) stack disposed on a first side of the element. The RDL stack can comprise an insulating layer and a conductive redistribution layer. The electronic device can comprise a passive electronic device assembly mounted and electrically connected to the RDL stack. The sensor module can further include an imaging sensor assembly, the electronic device mounted to the imaging sensor assembly.

BRIEF DESCRIPTION OF THE DRAWINGS

Embodiments of this disclosure will now be described, by way of non-limiting example, with reference to the accompanying drawings.

DETAILED DESCRIPTION

Various embodiments disclosed herein relate to an integrated device package including an electronic device with a passive device assembly mounted to a redistribution layer (RDL) stack disposed over a surface of an integrated device die. In some packages, passive electronic device(s) may be mounted to a substrate, such as a system board or a package substrate, adjacent the integrated device die. In such packages, the footprint may be larger than desired due to the laterally-adjacent mounting arrangement of the passive electronic device(s). Moreover, mounting the passive electronic device(s) adjacent the integrated device die and electrically connecting them via the substrate may increase the length of the electronic signal pathways between the passive electronic device(s) and the integrated device die, which can lead to electrical losses, noise, and reduced performance.

In embodiments disclosed herein, the performance of the package can be improved by mounting the passive electronic device(s) nearer to the active electronic circuitry of the integrated device die, e.g., by mounting the passive electronic device(s) to the RDL stack disposed over the die. In some embodiments, the passive electronic device(s) can be mounted over the die within the lateral footprint of the die, which can also beneficially reduce the overall footprint of the package.

Moreover, in some embodiments, the package (including the passive device(s) mounted to the RDL stack) can be mounted to an imaging sensor assembly and can be configured to process signals transduced by the sensor assembly. For example, as explained herein, the sensor assembly can comprise a sensor die mounted to a sensor substrate. The sensor die (e.g., a photodiode array, or PDA) can transduce electromagnetic radiation to electrical signals. The signals can be transmitted to the package by way of the sensor substrate. Beneficially, the packages with passive electronic device(s) can provide a reduced footprint, which can be important for various types of sensor assemblies.

Figure 1:
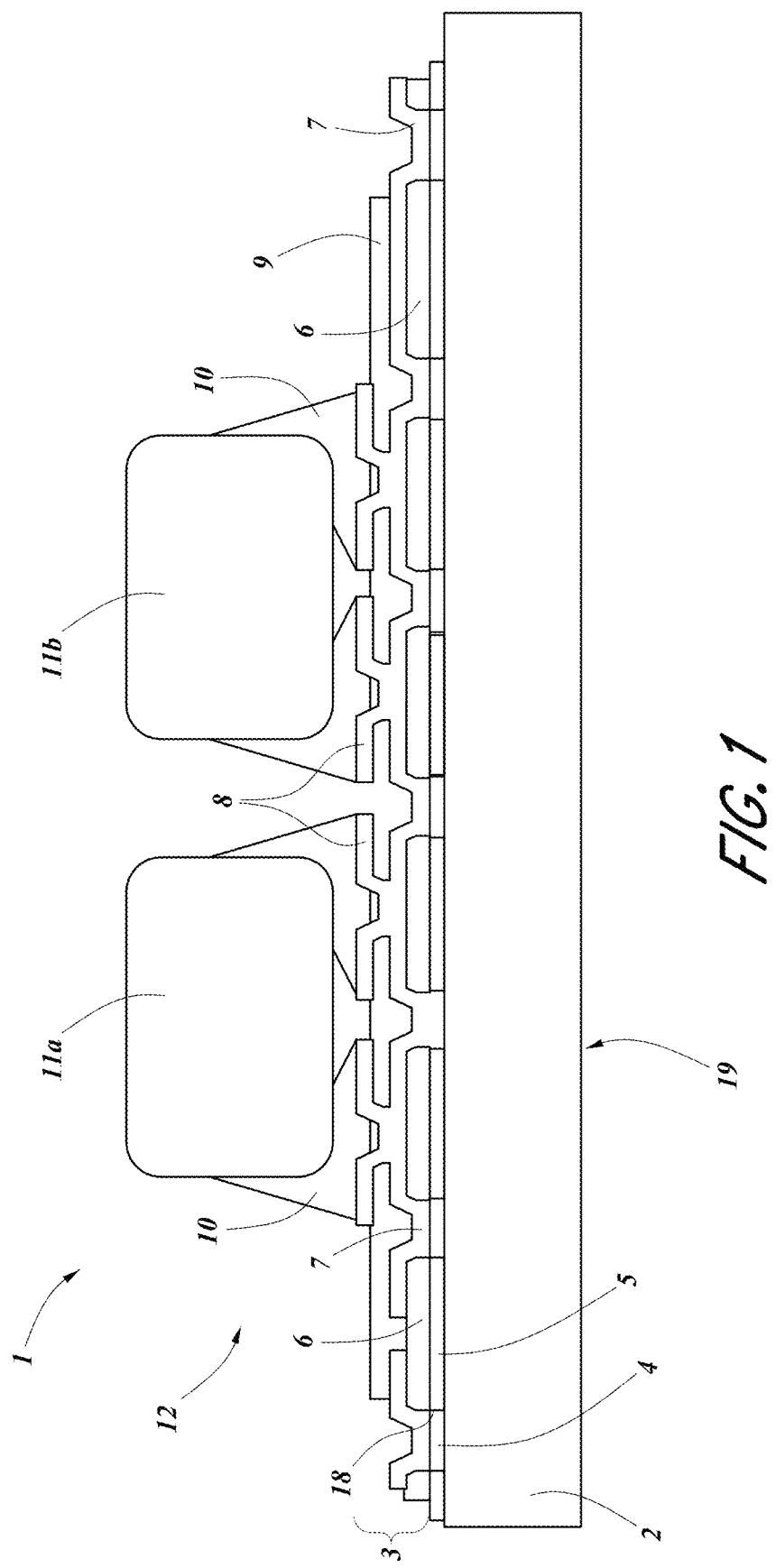
FIG. 1 is a schematic side sectional view of an electronic device, according to one embodiment.

FIG. 1 is a schematic side sectional view of an electronic device 1, according to one embodiment. The device 1 can comprise an element that comprises an integrated device die 2 having active components (e.g., active circuitry) formed therein. The element of FIG. 1 is an integrated device die; in other embodiments, however, as explained below in connection with FIG. 3, the element can comprise another suitable device such as an interposer. The integrated device die 2 can comprise a semiconductor die, such as a die formed from silicon, germanium, or other Group semiconductor material combinations. The integrated device die 2 can comprise any suitable type of device die, such as a processor die, a memory die, a microelectromechanical systems (MEMS) die, a sensor die, etc. As explained herein in connection with FIG. 3, for example, the die 2 can comprise a processor die configured to process signals transduced by a sensor assembly. An upper surface 18 of the die 2 can comprise a plurality of conductive bond pads 4 exposed through an insulating passivation layer 5. In some arrangements, the passivation layer 5 can overlap a portion of the bond pad 4 to define a bonding area. In various embodiments, the bond pads 4 and passivation layer 5 can be patterned on the die 2, for example, during wafer fabrication. The conductive bond pads 4 can comprise any suitable type of conductive material, such as copper. The passivation layer 5 can comprise an insulating or dielectric material, such as silicon oxide, silicon nitride, etc. The RDL stack 3 can be disposed over the active circuitry in some arrangements. In some embodiments, the active circuitry of the die 2 can be disposed at or near the upper surface 18 of the die 2. In other embodiments, the active circuitry of the die 2 can be disposed at or near an opposing lower surface 19 of the die 2 with the bond pads 4 connected by way of through semiconductor vias (TSVs). In still other embodiments, the active circuitry of the die 2 can be disposed in the die 2 between the upper and lower surfaces 18, 19.

A redistribution layer (RDL) stack 3 can be provided on the upper surface 18 of the element, which is the die 2 in the embodiment of FIG. 1. A passive device assembly 12 can be mounted to the RDL stack 3 of the element. The RDL stack 3 can comprise one or multiple layers of insulating and conductive materials to provide electrical communication between the bond pads 4 of the die 2 and other devices. RDL is typically employed to provide connection points to other devices (e.g., via solder bumps or wire bonds) with a geometrically different pattern than provided by the bond pads 4 in the die 2. For example, the RDL stack 3 can be configured to laterally fan out or fan in signal input-output (I/O) pads for connection to an external device.

In the illustrated embodiment, the passive device assembly 12 comprises one or a plurality of passive electronic devices 11a, 11b mounted to the RDL stack 3 by way of conductive adhesive 10 (e.g., solder paste, conductive epoxy, anisotropic conductive film, or any other suitable adhesive). The passive electronic devices 11a, 11b can comprise any suitable type of passive device, such as any suitable surface mount technology (SMT) component. For example, the passive electronic devices 11a, 11b can comprise one or more of a capacitor, an inductor, a resistor, etc. The passive devices 11a, 11b can be used for isolation, noise filtering, regulation, etc. In some arrangements, metal lids can be provided in localized regions of the package 2 for electromagnetic interference shielding. However, in the illustrated embodiment, it may be preferable to utilize a molding compound for sensor assembly applications in order to protect the overmolded components. Moreover, some devices that utilize lids to define cavities may do so to shield the entirety of the integrated device die. In some embodiments, such as imaging sensor applications, only one side of the die and/or passive assembly may be subject to harmful radiation such that the passive devices and/or die may be overmolded. Beneficially, therefore, the embodiments disclosed herein can utilize a molding compound which may be more cost effective than incorporating metal lids for additional shielding. Although two devices 11a, 11b are shown in FIG. 1, it should be appreciated that any suitable number of passive devices can be provided, including one, three, four, or more than four passive electronic devices.

The RDL stack 3 shown in FIG. 1 can comprise a plurality of insulating and conductive layers. For example, as shown in FIG. 1, the RDL stack 3 can include a first insulating repassivation layer 6 and a conductive redistribution layer (RDL) 7. In some embodiments, the repassivation layer 6 and conductive RDL 7 can be provided in a separate fabrication facility, e.g., in a back-end-of-line (BEOL) facility. In some embodiments, the RDL stack 3 can be formed before dicing the wafer (e.g., during wafer-level processing) or after dicing the wafer (e.g., on a reconstituted wafer with an insulating material, such as a polymer, between diced chips). In some embodiments, the repassivation layer 6 can be deposited over the upper surface 18 of the die 2 and can be patterned so as to expose the underlying bond pads 4. The conductive RDL 7 can be deposited over the repassivation layer 6 and can extend into apertures defined in the repassivation layer 6 so as to provide mechanical and electrical connection to the bond pads 4.

A second insulating repassivation layer 9 can be provided over the conductive RDL 7 and over portions of the first repassivation layer 6 in gaps provided in the conductive RDL 7. As with the first repassivation layer 6, the second repassivation layer 9 can be patterned to expose portions of the conductive RDL 7. An underbump metallization (UBM) layer 8 can be provided over the second repassivation layer 9 and over exposed portions of the conductive RDL 7. As shown, the UBM layer 8 can electrically connect to exposed portions of the conductive RDL 7. In the illustrated embodiment, the RDL stack 3 includes two insulating layers (layers 6, 9) and two conductive layers (layers 7, 8), but it should be appreciated that any suitable number of insulating and conductive layers can be used for the RDL stack 3.

The first and second insulating repassivation layers 6, 9 can comprise any suitable type of insulating or dielectric material. For example, in some embodiments, the repassivation layers 6, 9 can comprise an inorganic dielectric, such as silicon oxide, silicon nitride, silicon oxynitride, etc., or can comprise an organic dielectric such as a polymer, e.g., an epoxy, polyimide, benzocyclobutene (BCB), polybenzoxazole (PBO), or any other suitable dielectric material. The conductive RDL 7 and the UBM layer 8 comprise conductive materials, such as any suitable metal, for example, copper, aluminum, etc. The passive electronic devices 11a, 11b can electrically connect to the UBM layer 8 by way of the conductive adhesive 10. Thus, the RDL stack 3 can provide electrical communication between the passive devices 11a, 11b and active circuitry in the die 2 by way of the UBM layer 8, the conductive RDL 7, and the bond pads 4 of the die 2.

In the illustrated embodiment, the passive devices 11a, 11b are positioned so as to overlie the integrated device die 2, e.g., so as to be disposed within a lateral footprint of the die 2. In such an arrangement, the overall lateral footprint of the package can be reduced, as compared to packages that provide passive devices adjacent the die 2 on a package substrate. Furthermore, positioning the passive devices 11a, 11b to be near the active circuitry can beneficially reduce electrical noise and losses. For example, in some embodiments, the active circuitry can be provided at or near the upper surface 18 near the RDL stack 3, so as to reduce signal transmission distances and losses. In other embodiments, the passive devices 11a, 11b and the RDL stack 3 may be provided on the back side of the die, and through substrate vias (TSVs) can provide electrical communication between the active circuitry and the RDL stack 3 and devices 11a, 11b. In some arrangements, the passive devices 11a, 11b can overlie the active circuitry in the die. In other embodiments, the passive devices 11a, 11b may not overlie the active circuitry. In the illustrated embodiment, the RDL stack 3 provides a fan-in electrical connection in which signals from the bond pads 4 are transferred laterally inward to corresponding contacts or leads of the passive devices 11a, 11b. As explained below, however, in other embodiments, the RDL stack 3 can provide a fan-out electrical connection to passive devices that may be at least partially laterally offset from the die 2.

Although not shown in FIG. 1, the device 1 can be mounted to any suitable type of package substrate, such as a printed circuit board (PCB), leadframe, ceramic substrate, etc. In some embodiments, the passive device assembly 12 can be mounted to the die 2 before mounting the die 2 to the package substrate. In other embodiments, the die 2 can be mounted to the substrate before mounting the passive device assembly 12 to the die 2. In some embodiments, a molding compound or encapsulant can be provided over the die 2 and the RDL stack 3. For example, the die 2 and passive devices 11a, 11b can be packaged in an arrangement similar to that shown in FIG. 2A, as explained below. In other embodiments, a package lid can be provided over the die 2 and RDL stack 3, with a gas (e.g., air) cavity disposed between the package lid and the die 2. Still other packaging arrangements may be suitable. In some embodiments, the RDL stack 3 can be arranged to provide a fan-out electrical configuration. In such an embodiment, molding compound can be provided over a portion of the die 2, and the RDL stack 3 can be provided over the die 2 and over portions of the molding compound that extend laterally outward of the die 2. In some embodiments, the UBM layer 8 can extend laterally outward from the die, and one or more passive devices 11a, 11b can be mounted to the UBM layer 8 such that portions of the passive devices 11a, 11b are laterally offset from the die 2.

Figure 2A:
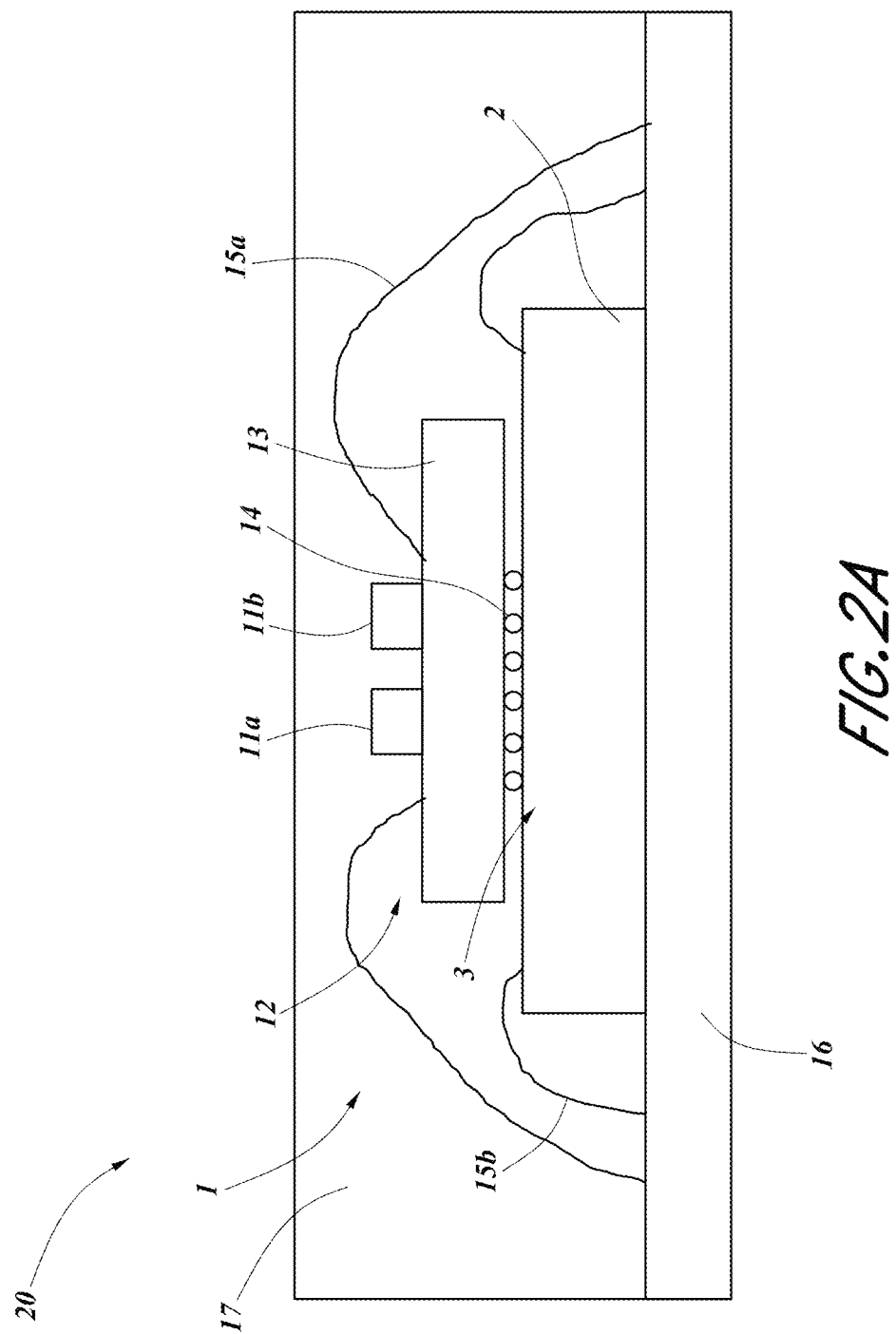
FIG. 2A is a schematic side sectional view of an integrated device package including an electronic device, according to another embodiment.

FIG. 2A is a schematic side sectional view of an integrated device package 20 including an electronic device 1, according to another embodiment. Unless otherwise noted, the components of FIG. 2A may be the same as or generally similar to like-numbered components of FIG. 1. For example, as with FIG. 1, the embodiment of FIG. 2A includes a passive device assembly 12 mounted to an RDL stack 3 (see FIG. 1 for details) on a surface of an integrated device die 2. In the embodiment of FIG. 2A, the die 2 can be mounted to a package substrate 16 by way of an adhesive (not shown). As explained above, the package substrate can comprise any suitable type of substrate, such as a PCB, leadframe, ceramic substrate, etc. In various embodiments, such as FIG. 3, the package substrate 16 can have bond pads configured to electrically communicate with corresponding pads of a sensor assembly. The package substrate 16 can comprise an insulating substrate having conductive traces therein.

As with the embodiment of FIG. 1, the RDL stack 3 can be formed on the upper surface 18 of the die 2. Unlike the embodiment of FIG. 1, however, in the embodiment of FIG. 2A, the passive device assembly 12 comprises an interposer 13 mounted to the RDL stack 3 by a conductive adhesive (e.g., by solder balls or bumps 14). In some embodiments, the interposer 13 can comprise a dummy interposer having traces and vias to route signals but without active processing circuitry. In other embodiments, the interposer 13 can comprise an electrically active interposer having active processing circuitry. The passive electronic devices 11a, 11b can be mounted to the interposer 13 by way of a conductive adhesive (not shown in FIG. 2A). The interposer 13 can comprise any suitable type of interposer, for example, a laminate structure, a PCB substrate, a ceramic interposer, a semiconductor (e.g., silicon) interposer, etc. The interposer 13 can electrically connect to the package substrate 16 by way of wire bonds 15a. Thus, in some embodiments, the passive device assembly 12 can beneficially communicate with both the package substrate 16 (e.g., by way of wire bonds 15a) and the die 2 (e.g., by way of a flip chip arrangement with solder balls 14). Alternatively, the interposer may be solely connected to the package substrate 16 by way of die 2, for example, by way of the solder bumps 14. The die 2 can electrically connect to the package substrate 16 by way of wire bonds 15b. Alternatively, the die 2 can include TSVs with the active side up or down. While not illustrated, it will be understood that the package substrate 16 also includes leads on outer surfaces for electrical connection to larger systems, such as a system board. External leads can take various forms depending upon the structure of the package substrate 16, such as lead frame leads, solder balls, etc.

It should also be appreciated that the electronic device 1 and passive device assembly 12 of FIG. 1 can be used in the package 20 instead of the interposer 13 shown in FIG. 2A. In such embodiments, the passive device assembly 12 (including, e.g., the passive devices 11a, 11b) can be mounted directly to the RDL stack 3 of the die 2 without the interposer. The molding compound 17 can be provided over the passive devices 11a, 11b, die 2, and exposed upper portions of the package substrate 16.

A molding compound 17 or encapsulant can be provided over the passive devices 11a, 11b, the interposer 13, the wire bonds 15a, 15b, and the die 2 to protect the package components from the outside environs. As with the embodiment of FIG. 1, the package 20 of FIG. 2A can beneficially reduce overall package footprint while improving electrical performance of the package 20. For example, as with FIG. 1, the passive device assembly 12 (e.g., the passive devices 11a, 11b and the interposer 13) can lie within a lateral footprint of the die 2. In other embodiments, however, at least a portion of the passive device assembly 12 can lie outside the lateral footprint of the die 2.

As explained above, various embodiments disclosed herein relate to a sensor module configured for use in imaging systems, such as in digital X-ray imaging systems, computed tomography (CT) imaging systems, ultrasound imaging systems, or any other suitable imaging system. For example, the passive integrated device assemblies of FIGS. 1 and 2A can be provided in the sensor assembly to condition or otherwise operate on signals transduced by a sensor assembly. Beneficially, the reduced footprint provided by the electronic device 1 and package 20 can enable the sensor module to also have a reduced footprint.

Figure 2B:
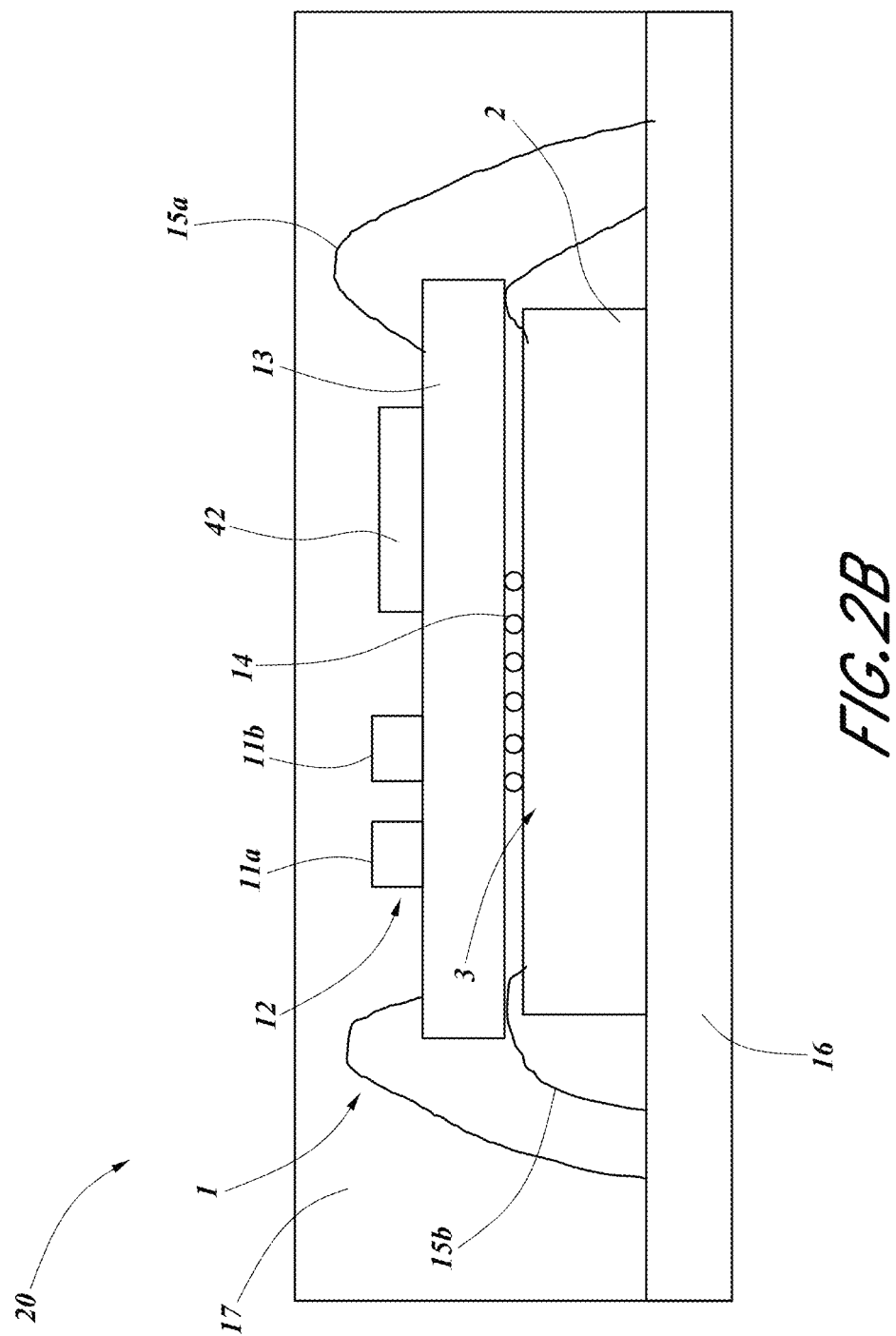
FIG. 2B is a schematic side sectional view of an integrated device package including an electronic device, according to another embodiment.

FIG. 2B illustrates another embodiment of an integrated device package 20. FIG. 2B is generally similar to the package 20 shown in FIG. 2A. Unless otherwise noted, reference numerals in FIG. 2B represent components that are the same as or generally similar to like-numbered components of FIG. 2A. In the embodiment of FIG. 2B, the interposer 13 may be laterally larger than a corresponding lateral footprint of the integrated device die 2. The larger interposer 13 of FIG. 2B can advantageously accommodate numerous electrical components which can improve the functionality of the package 20. For example, one or more additional active device die(s) 42 can be mounted to the interposer 13 by way of a suitable conductive adhesive. The device die(s) 42 can process and/or test components of the package 20, including signals from the die 2 and/or components mounted to the interposer 13.

Figure 3:
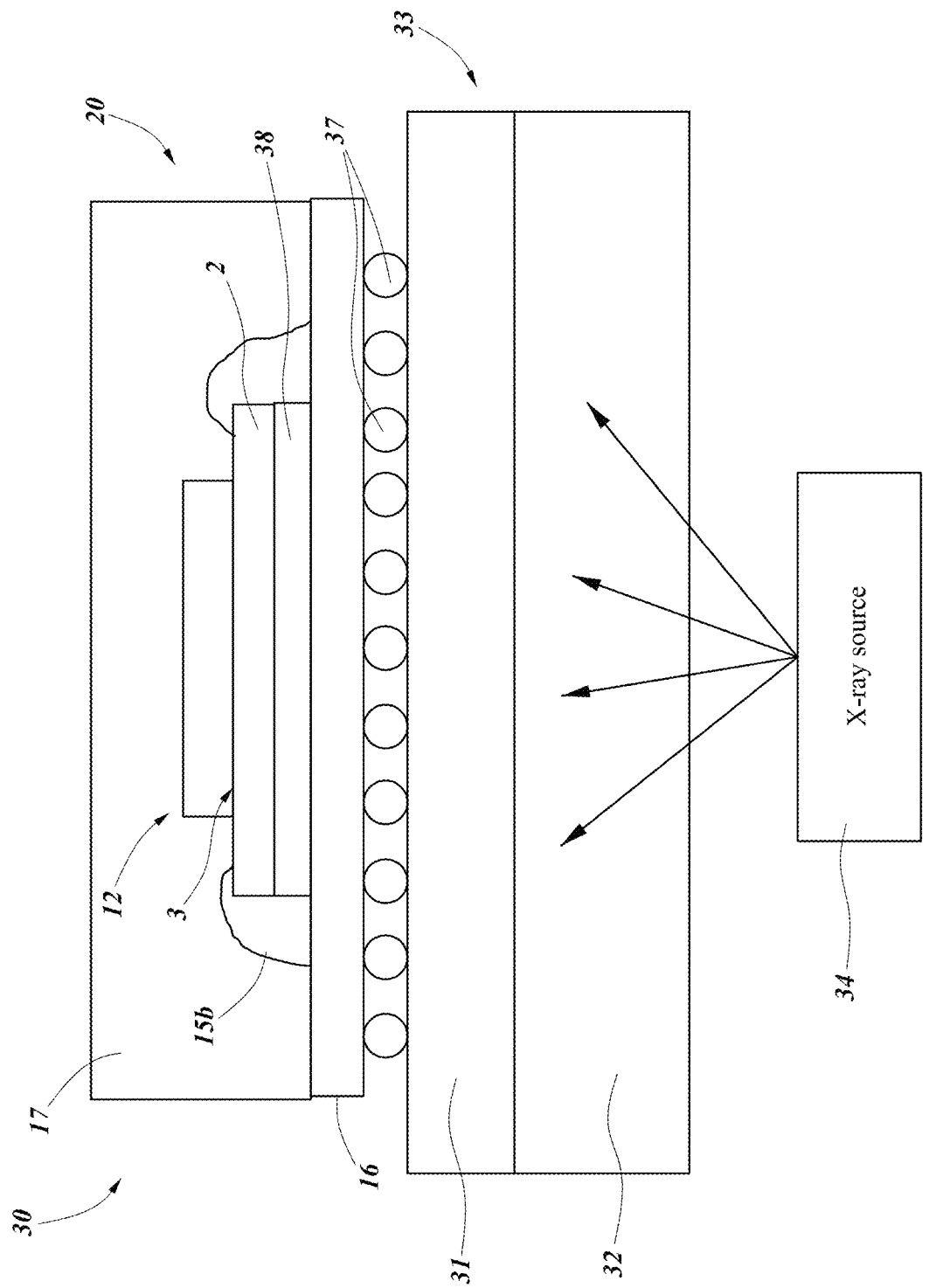
FIG. 3 is a schematic side sectional view of a sensor module according to one embodiment.

FIG. 3 is a schematic side sectional view of a sensor module 30 according to one embodiment. The sensor module 30 can comprise an imaging sensor assembly 33 and an integrated device package 20 mounted to the sensor assembly 3. The integrated device package 20 can be the same as or different from the package 20 described above. The package 20 can comprise any suitable type of passive device assembly 12. For example, the passive device assembly 12 can comprise passive electronic devices 11a, 11b mounted to the RDL stack 3 of an element by an adhesive. In other embodiments, the passive device assembly 12 can comprise passive devices 11a, 11b mounted to an interposer 13 which is mounted to the RDL stack 3 of the element. For example, in some embodiments, the element can comprise the integrated device die 2 as in FIGS. 1 and 2, and the passive device assembly 12 can be mounted to the integrated device die 2. In other embodiments, the element can comprise another suitable structure such as an interposer, substrate, other type of device, etc.

An illumination source 34, such as an X-ray source or any other suitable source of electromagnetic radiation can be provided and can direct electromagnetic radiation to the sensor assembly 33. In various embodiments, although not shown herein, an object (such as a human patient, or any other suitable target object) can be provided between the illumination source 34 and the sensor assembly 33. Additional details regarding sensor assemblies and components provided therefor may be found throughout U.S. Pat. Nos. 8,829,454; 9,116,022; and 10,340,302, the entire contents of each of which are hereby incorporated by reference in their entirety and for all purposes.

The sensor assembly 33 can include a sensor substrate 31 and one or more sensor dies 32 mounted to a front side of the sensor substrate 31. The sensor substrate 31 can comprise any suitable type of substrate, such as a laminate substrate, a printed circuit board (PCB) substrate, a semiconductor interposer, a flexible substrate comprising a polymer with embedded traces, or any other suitable substrate having a nonconductive base with embedded conductive traces or interconnects. The sensor die 32 can comprise a photodiode array (PDA) having a plurality of photosensitive elements that convert electromagnetic radiation to an electrical current. Although not shown, radiation modifiers, such as filters or scintillators, can be provided over the front side of the sensor assembly 33. The sensor die 32 can accordingly transduce light impinging on the PDA into electrical signals which can be conveyed to conductive traces in the sensor substrate 31. In some embodiments, the sensor die 32 can be electrically connected to the sensor substrate 31 by way of a conductive adhesive, such as solder bumps, anisotropic conductive film (ACF), a conductive epoxy, etc.

The package 20 can be mounted to the sensor assembly 33 by way of a conductive adhesive, for example, a plurality of solder balls 37, a conductive epoxy, etc. The package 20 can one or more active integrated device dies in addition to the passive device assembly 12, as explained above. The die 2 can comprise active processing circuitry configured to process electrical signals (e.g., analog signals) transduced by the sensor die 32 and transferred to the package 20 by way of the sensor substrate 31. The devices of the package 20 can process these signals in any suitable manner, including, for example, signal filtering, analog-to-digital conversion, etc. The signals processed by the devices of the package 20 can be transferred out of the package 20 (for example, by way of a system motherboard) to the larger electronic system to be rendered on a display or otherwise further processed in order to analyze the imaged object.

Furthermore, the package 20 or the sensor assembly 33 can comprise one or more radiation shields 38 to shield sensitive circuitry from harmful electromagnetic radiation. The shield 38 can comprise any suitable material selected to block harmful radiation (e.g., x-rays) from impinging upon sensitive circuitry, for example, sensitive circuitry of the die 2. In some embodiments, the shield 38 can comprise tungsten. In FIG. 3, for example, the radiation shield 38 can be attached to the package substrate 16 by an adhesive. The die 2 can be mounted to the shield 38 and positioned such that sensitive circuitry of the die 2 is within the lateral footprint of the shield 38. Although the shield 38 is shown as part of the package 20 and mounted to the substrate 16, in other embodiments, the shield 38 can be placed elsewhere within the sensor module 30 between the sensor die(s) 32 and the sensitive circuitry (e.g., sensitive circuitry of the die 2). For example, the shield 38 can be placed between the sensor assembly 33 and the package 20, within the sensor assembly 33, at other locations in the package 20, etc. Additional examples of components used in sensor modules 30 (including radiation shields and other components) may be found throughout U.S. Pat. Nos. 8,829,454; 9,116,022; and 10,340,302, the entire contents of each of which are hereby incorporated by reference in their entirety and for all purposes.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated device package comprising:
   a package substrate;
   an integrated device die having active electronic circuitry, the integrated device die having a first side and a second side opposite the first side, the first side comprising bond pads electrically connected to the package substrate by way of bonding wires, the integrated device die disposed over the package substrate such that the second side faces the package substrate, the bonding wires extending from the bond pads at the first side of the integrated device die to the package substrate;
   a redistribution layer (RDL) stack disposed on the first side of the integrated device die, the RDL stack comprising an insulating layer and a conductive redistribution layer; and
   a passive electronic device assembly mounted and electrically connected to the RDL stack, the passive electronic device assembly disposed over the integrated device die,
   wherein the passive electronic device assembly comprises an interposer mounted to the RDL stack and one or more passive electronic devices mounted to the interposer, and
   wherein the one or more passive electronic devices lie within a lateral footprint of the integrated device die and within a lateral footprint of the package substrate.

2. The integrated device package of claim 1, wherein the one or more passive electronic devices comprises one or more of a capacitor, an inductor, and a resistor.

3. The integrated device package of claim 2, wherein the one or more passive electronic devices comprises a capacitor.

4. The integrated device package of claim 1, wherein the passive electronic device assembly is mounted to the RDL stack by way of a conductive adhesive.

5. The integrated device package of claim 1, wherein the interposer comprises a first side and a second side opposite the first side, the first side electrically connected to the package substrate by way of bonding wires.

6. The integrated device package of claim 1, further comprising an active device die mounted to the interposer.

7. The integrated device package of claim 1, wherein the RDL stack comprises a first insulating repassivation layer disposed over the die and a conductive redistribution layer (RDL) disposed in gaps in the first insulating repassivation layer.

8. The integrated device package of claim 7, further comprising a second insulating repassivation layer disposed over the conductive RDL and an underbump metallization (UBM) layer disposed in gaps of the second insulating repassivation layer, the passive electronic device assembly electrically connected to the UBM layer.

9. The integrated device package of claim 1, wherein the second side of the integrated device die is mounted to the package substrate by way of an adhesive, and wherein a molding compound disposed over the integrated device die and the passive electronic device assembly.

10. A sensor module comprising an imaging sensor assembly and the integrated device package of claim 1, the integrated device package mounted to the imaging sensor assembly.

11. The sensor module of claim 10, further comprising a radiation shield positioned between a sensor die of the imaging sensor assembly and the integrated device die.

12. A sensor module comprising:
an electronic device comprising:
an element and a redistribution layer (RDL) stack disposed on a first side of the element, the RDL stack comprising an insulating layer and a conductive redistribution layer, the first side of the element comprising bond pads electrically connected to a package substrate by way of bonding wires, and
a passive electronic device assembly mounted and electrically connected to the RDL stack,
wherein the passive electronic device assembly comprises an interposer mounted to the RDL stack and one or more passive electronic devices mounted to the interposer, wherein the one or more passive electronic devices lie within a lateral footprint of the RDL stack and within a lateral footprint of the package substrate; and
an imaging sensor assembly, the electronic device mounted to the imaging sensor assembly.

13. The sensor module of claim 12, wherein the imaging sensor assembly comprises a sensor substrate and a sensor die mounted to the sensor substrate.

14. The sensor module of claim 12, wherein the element comprises an integrated device die.

15. The sensor module of claim 14, further comprising a radiation shield between the sensor die and the integrated device die.

16. The sensor module of claim 14 wherein the integrated device die is mounted to a package substrate, the integrated device die electrically connected to the package substrate by bonding wires.

17. The sensor module of claim 14, further comprising a molding compound disposed over the integrated device die and the passive electronic device assembly.

* * * * *